United States Patent
Shacklette et al.

(10) Patent No.: US 9,437,911 B1
(45) Date of Patent: Sep. 6, 2016

(54) COMPLIANT HIGH SPEED INTERCONNECTS

(71) Applicant: HARRIS CORPORATION, Melbourne, FL (US)

(72) Inventors: Lawrence W. Shacklette, Melbourne, FL (US); Michael R. Weatherspoon, West Melbourne, FL (US); Joshua P. Bruckmeyer, W. Melbourne, FL (US); Arthur Wilson, W. Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 14/718,765

(22) Filed: May 21, 2015

(51) Int. Cl.
*H01P 3/06* (2006.01)
*H01P 11/00* (2006.01)

(52) U.S. Cl.
CPC ............... *H01P 3/06* (2013.01); *H01P 11/005* (2013.01)

(58) Field of Classification Search
CPC .................................. H01P 3/06; H01P 11/05
USPC ......................................................... 333/245
See application file for complete search history.

(56) References Cited

U.S. PATENT DOCUMENTS

| | | | |
|---|---|---|---|
| 4,673,904 A | 6/1987 | Landis | |
| 6,143,616 A | 11/2000 | Geusic et al. | |
| 6,449,308 B1 | 9/2002 | Knight, Jr. et al. | |
| 7,649,432 B2 | 1/2010 | Sherrer et al. | |
| 7,656,256 B2 | 2/2010 | Houck et al. | |
| 7,781,727 B2 | 8/2010 | Sherrer et al. | |
| 7,888,793 B2 | 2/2011 | Sherrer et al. | |
| 7,898,356 B2 | 3/2011 | Sherrer et al. | |
| 7,948,335 B2 | 5/2011 | Sherrer et al. | |
| 8,031,037 B2 | 10/2011 | Sherrer et al. | |
| 8,542,079 B2 | 9/2013 | Sherrer et al. | |
| 8,659,371 B2 | 2/2014 | Fonataine et al. | |
| 8,698,577 B2 | 4/2014 | Sherrer et al. | |

(Continued)

FOREIGN PATENT DOCUMENTS

| | | |
|---|---|---|
| EP | 1939137 A2 | 7/2008 |
| EP | 1939974 A1 | 7/2008 |
| WO | 92/05457 A1 | 4/1992 |

OTHER PUBLICATIONS

Abusultan, M and LaMeres, B.J. Off-Chip Coaxial-to-Coplanar Transition Using MEMs Trench, 3D/SiP Advanced Packaging Symposium, Apr. 28-30, 2008 (5 pages).

*Primary Examiner* — Stephen E Jones
*Assistant Examiner* — Scott S Outten
(74) *Attorney, Agent, or Firm* — Fox Rothschild LLP; Robert J. Sacco; Carol E. Thorstad-Forsyth

(57) ABSTRACT

Systems (100) and methods (900) for providing a compliant micro-coaxial interconnect with an integrated circuit or other electronic device. The methods comprise: forming a well (108) in a first substrate (102) having a first Coefficient of Thermal Expansion ("CTE"); forming at least one three-dimensional micro-coaxial interconnect (100) on the first substrate so as to have a cantilevered end portion (110) disposed over the well; and using a first coupler (606) to electrically couple the cantilevered end portion to a second substrate (604) having a second CTE different from the first CTE. The cantilevered end portion has an angled joint (302) so that at least one of a pushing force and a pulling force applied thereby to the first coupler is minimized when mismatching movements of the first and second substrates occur.

19 Claims, 7 Drawing Sheets

(56) References Cited

U.S. PATENT DOCUMENTS

| | | |
|---|---|---|
| 8,703,603 B2 | 4/2014 | Sherrer et al. |
| 8,717,124 B2 | 5/2014 | Vanhille et al. |
| 8,742,874 B2 | 6/2014 | Sherrer et al. |
| 8,814,601 B1 | 8/2014 | Sherrer et al. |
| 8,866,300 B1 | 10/2014 | Sherrer et al. |
| 8,917,150 B2 | 12/2014 | Vanhille et al. |
| 8,933,769 B2 | 1/2015 | Houck et al. |
| 2003/0214802 A1 | 11/2003 | Fjelstad et al. |
| 2007/0194431 A1 | 8/2007 | Corisis et al. |
| 2008/0246562 A1* | 10/2008 | Sherrer .............. H01P 3/06 333/260 |
| 2009/0267201 A1* | 10/2009 | Chang .............. H01L 23/66 257/664 |
| 2010/0097158 A1* | 4/2010 | Eppich .............. H01P 5/085 333/33 |
| 2010/0109819 A1 | 5/2010 | Houck et al. |
| 2014/0300428 A1 | 10/2014 | Toyao |

* cited by examiner

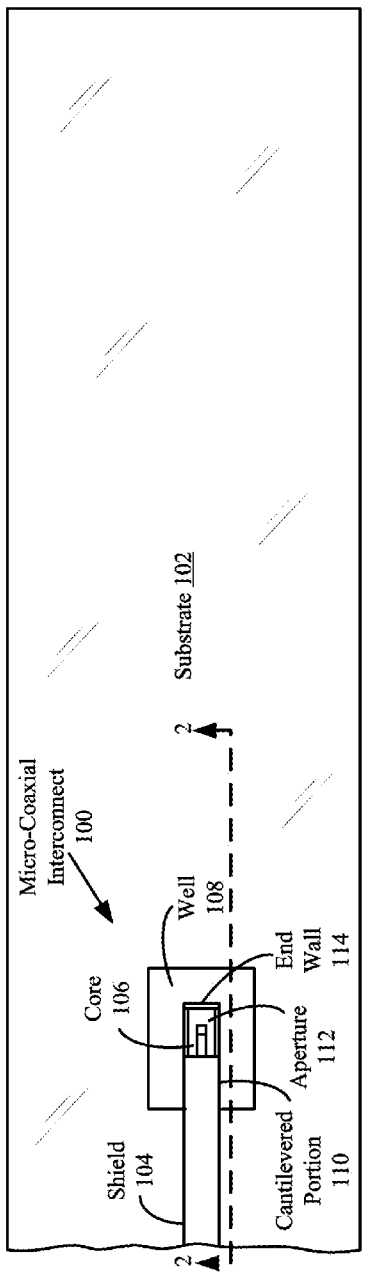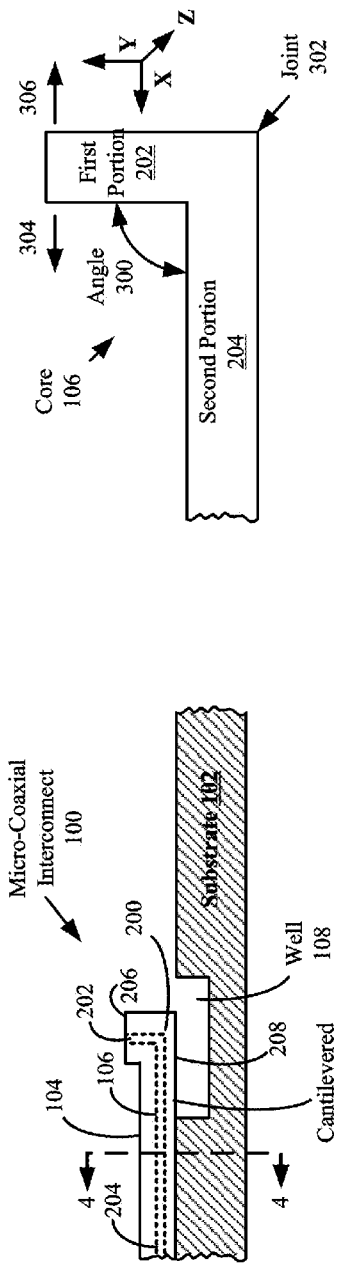
FIG. 1
FIG. 2
FIG. 3

COMPLIANT HIGH SPEED INTERCONNECTS

BACKGROUND OF THE INVENTION

1. Statement of the Technical Field

This document relates to micro-coaxial waveguides in Integrated Circuits ("ICs") and Multi-Chip Modules ("MCMs"). More particularly, this document concerns micro-coaxial waveguides for mechanically compliant high-speed interconnects between substrates of differing thermal expansion coefficients.

2. Description of the Related Art

Photonic Systems on Chips ("SoCs") consist of multiple die on a common substrate. Silicon is typically used for the common substrate material. Silicon has well known properties and an ability to integrate digital and analog circuitry. The SoC approach: reduces Size, Weight and Power ("SWaP"); improves performance by integrating multiple functions; reduces performance variability and cost in production with the use of lithographic manufacturing; and enables higher speeds/wider bandwidths for telecommunications and military systems.

High performance optical devices are typically formed of Lithium Niobate (e.g., LiNbO3) or an indium phosphide (e.g., InP) compound. Lithium Niobate devices possess a Thermal Coefficient of Expansion ("CTE") that is much different from that of the common silicon substrate. Frequently, interposer layers are required between each Lithium Niobate device and the common silicon substrate. Wire bonds are also required, which flex to compensate for the mechanical dimensional changes over temperature and must be placed singly during manufacture. Interposer layers and wire bonds are well known in the art. Still, it should be understood that the interposer layers and wire bonds can detrimentally impact bandwidth and performance of the optical device.

Optical communication data rates are continually increasing, requiring new devices and structures to provide the modulation/demodulation functions. Electronic Warfare ("EW") and Signals Intelligence ("SIGINT") markets desire the ability to observe and monitor all bands simultaneously in order to detect and deal with threats to the warfighter. The highest performance optical devices used in EW and telecommunications are looking for >100 GHz bandwidth. The bandwidth requirements of these optical devices will only increase over time.

Presently, preferred high speed interfaces to photonic devices in Photonic Integrated Circuits ("PICs") are Co-Planar Waveguides ("CPW") with ribbon bonds, geometry controlled wire-bonds, or 3D coaxial structures built around wire-bonds. Parasitics limit bandwidth and require the devices to account for these parasitics in the design stage (which is not always possible). Also, the cost of fabricating such interfaces is relatively expensive and slow as a consequence of having to create many individual wire bonds.

SUMMARY OF THE INVENTION

This disclosure concerns systems and methods for providing a compliant micro-coaxial interconnect with an IC or other electronic device. The methods comprise: forming a well in a first substrate (e.g., a silicon substrate) having a first CTE; forming at least one three-dimensional micro-coaxial interconnect on the first substrate so as to have a cantilevered end portion disposed over the well; and using a first coupler (e.g., solder or a conductive adhesive) to electrically couple the cantilevered end portion to a second substrate (e.g., a Lithium Niobate substrate) having a second CTE different from the first CTE. The cantilevered end portion has a first angled joint so that at least a pushing force and a pulling force applied thereby to the first coupler is minimized when mismatching movements of the first and second substrates occur, as described below.

In some scenarios, the three-dimensional micro-coaxial interconnect is formed using a semiconductor lithography based process. The micro-coaxial interconnect comprises a three-dimensional structure defined by an elongate conductive shield, an elongate conductive core disposed within the elongate conductive shield, an air gap between the elongate conductive shield and the elongate conductive core, and a plurality of dielectric straps suspending the elongate conductive core within the elongate conductive shield.

The first angled joint is defined by a first portion of the three-dimensional micro-coaxial interconnect that is angled relative to a second portion of the three-dimensional micro-coaxial interconnect by at least ten degrees. The first angled joint may reside along the cantilevered end portion of the three-dimensional micro-coaxial interconnect.

In some scenarios, the three-dimensional micro-coaxial interconnect comprises a second angled joint. The second angled joint allows movement of the cantilevered end portion in a direction different from a direction which is allowed by the first angled joint.

In yet other scenarios, the cantilevered portion may follow a serpentine or zigzag geometry to allow relative motion between chip and substrate without producing (a) excessive tension or compression along the micro-coaxial interconnect or (b) excessive shear or tension at the contacts to the substrate or the chip. An object of the present invention is to provide a means to relax shear and tensile stress through bending of the interconnect over an extended portion. This means of accommodation spreads mechanical distortion over a broad area and avoids stress concentration points that might cause breakage and loss of electrical continuity.

BRIEF DESCRIPTION OF THE DRAWINGS

Embodiments will be described with reference to the following drawing figures, in which like numerals represent like items throughout the figures, and in which:

FIG. 1 is a top perspective view of an exemplary structure for a compliant micro-coaxial interconnect disposed on a substrate.

FIG. 2 is a cross-sectional view of the exemplary structure shown in FIG. 1 taken across line 2-2 of FIG. 1.

FIG. 3 is a schematic illustration of a micro-coaxial interconnect's core.

DETAILED DESCRIPTION

Figure 4:
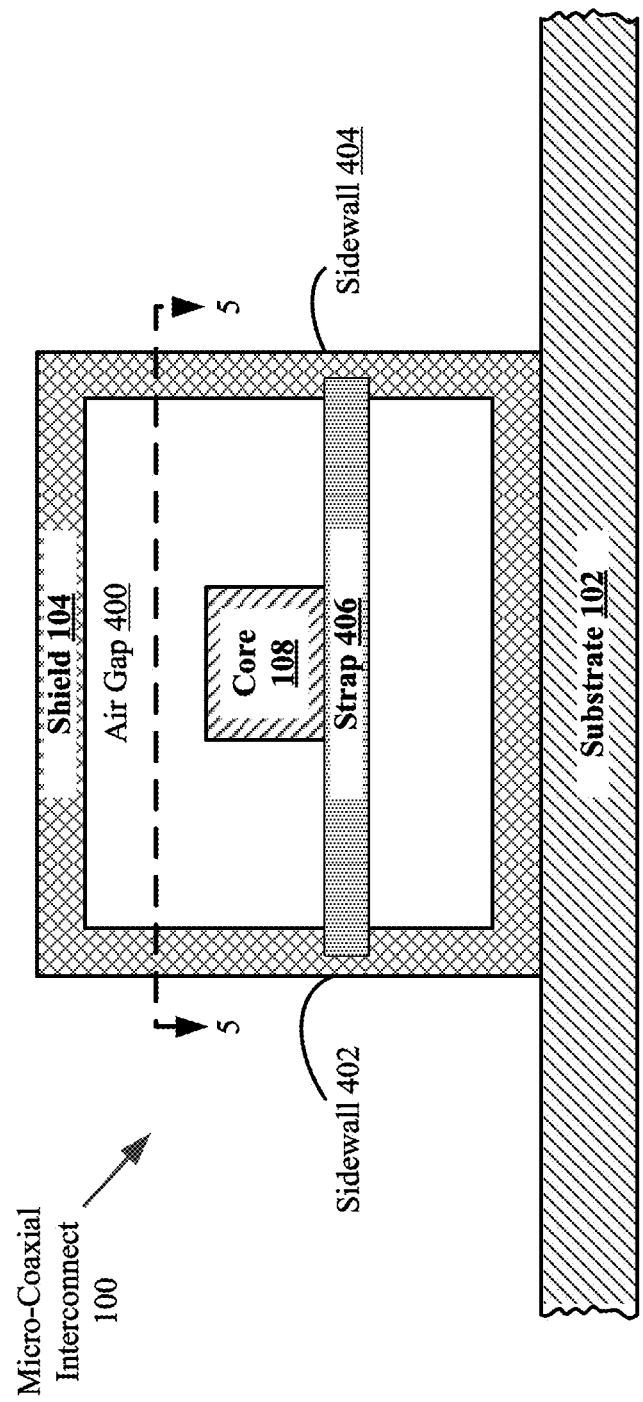
FIG. 4 is a cross-sectional view of the exemplary structure shown in FIGS. 1-3 taken along line 4-4 of FIG. 2.

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

It should also be appreciated that the terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Further, unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure concerns novel compliant micro-coaxial interconnects having portions cantilevered above the base substrate. Applications of the novel micro-coaxial interconnect technology enable higher data rate/bandwidth PICs for commercial telecommunications and government markets. The novel micro-coaxial interconnects can be applied to any designs where very large bandwidths need to be passed between: two substrates (e.g., a Lithium Niobate substrate and an underlying silicon substrate) having different CTEs which cause mismatching movements thereof; and/or two devices having different CTEs which cause mismatching movements thereof.

Notably, applications of the novel compliant micro-coaxial interconnects expand well beyond photonic SoCs to virtually any multiple substrate system where the individual substrates have a CTE miss-match. For example, a Radio Frequency ("RF") hybrid containing Bulk Acoustic Wave ("BAW"), Surface Acoustic Wave ("SAW"), and a silicon Analog-to-Digital Converter ("ADC") would all benefit from this controlled impedance mechanically compliant interconnect of this invention.

A first exemplary structure for a micro-coaxial interconnect 100 will now be discussed in relation to FIGS. 1-5. As shown in FIGS. 1-5, the micro-coaxial interconnect 100 is formed on a substrate 102. The substrate 102 is a dimensionally stable and flat substrate. In this regard, the substrate 102 can be formed of silicon, glass or other suitable material.

Notably, the present invention lies with the combination of micro-coaxial interconnects to accomplish high-speed analog or digital Radio Frequency ("RF") interconnects between substrates and/or devices with differing CTEs by cantilevering at least a portion of the coaxial structure from the base substrate 102. In this regard, a well 108 is formed in the substrate 102 at a location where a portion 110 of the micro-coaxial interconnect 100 is to be cantilevered. The well may have depth D that the substrate can accommodate (0<D<substrate thickness). In general, the cantilevered portion is not bound to the substrate and free to move laterally and vertically. In some scenarios, the cantilevered portion is weakly bonded to the substrate. In this case, the well may be filled with a soft underfill polymer (e.g., silicone, acrylate or urethane acrylate) having a shore hardness of less than about 50 D.

Figure 6:
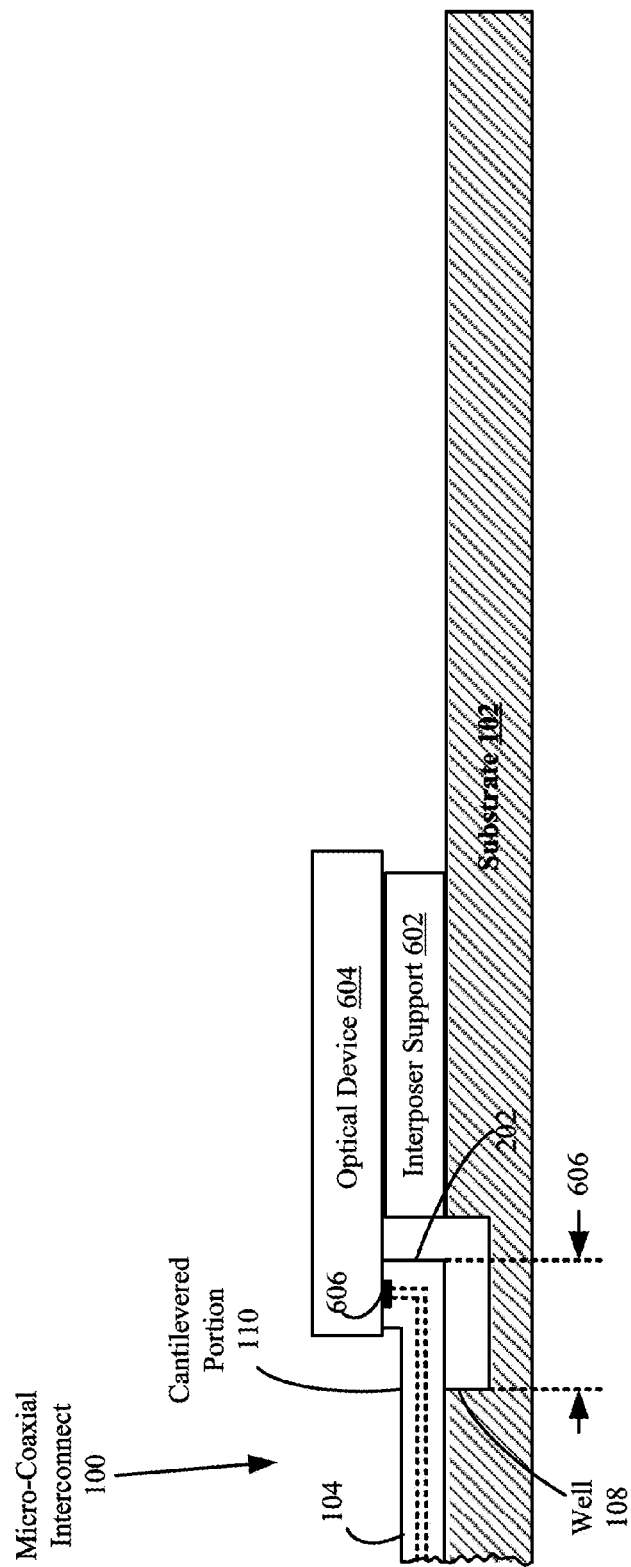
FIGS. 6-7 each provide a schematic illustration that is useful for understanding an optical device application for the micro-coaxial interconnect structure of FIGS. 1-5.

The well 108 facilitates the provision of a controlled impedance interface between two circuit components having different CTEs (e.g., a Silicon substrate 102 having a CTE of $2.6 \times 10^{-6}$/K and a Lithium Niobate optical device 604 of FIG. 6 having a CTE of $7.5\text{-}14.4 \times 10^{-6}$/K) with mechanical compliance comparable to wire or ribbon bonding, but with better impedance control, lower loss and lower dispersion. The invention also provides for low cost volume production with use of lithographic techniques as opposed to traditional wire bond interconnects, which must be placed singly.

The well 108 is formed and filled with a photoresist prior to the fabrication of the micro-coaxial interconnect 100 via a semiconductor lithography based process. The photoresist is removed from the well at some point in the semiconductor lithography process to form the cantilever.

Semiconductor lithography based processes for forming micro-circuit components are well known in the art, and therefore will not be described herein. Any known or to be known semiconductor lithography based process can be used herein without limitation. Still, it should be understood that the semiconductor lithography based process generally involves sequentially disposing a plurality of material layers on the substrate and removing photoresist layers so as to leave a desired electronic circuit pattern (formed of dielectric and conductive materials) on the substrate. Notably, the ability to concurrently fabricate a plurality of micro-coaxial interconnects via a semiconductor lithography based process results in a decreased overall fabrication cost for an electronic circuit as compared to that of electronic circuits employing conventional wire or ribbon bonded micro-coaxial interconnects (such as those discussed above in the Background Section of this document).

The micro-coaxial interconnect 100 comprises a shield 104 surrounding a core 106. The shield and core are both formed of a conductive material (e.g., solid copper) and have a thickness (e.g., at least 50μ) selected to ensure deformation thereof will not occur over time to at least the cantilevered portion 110. The same or different conductive material can be used to form the shield and core.

Figure 5:
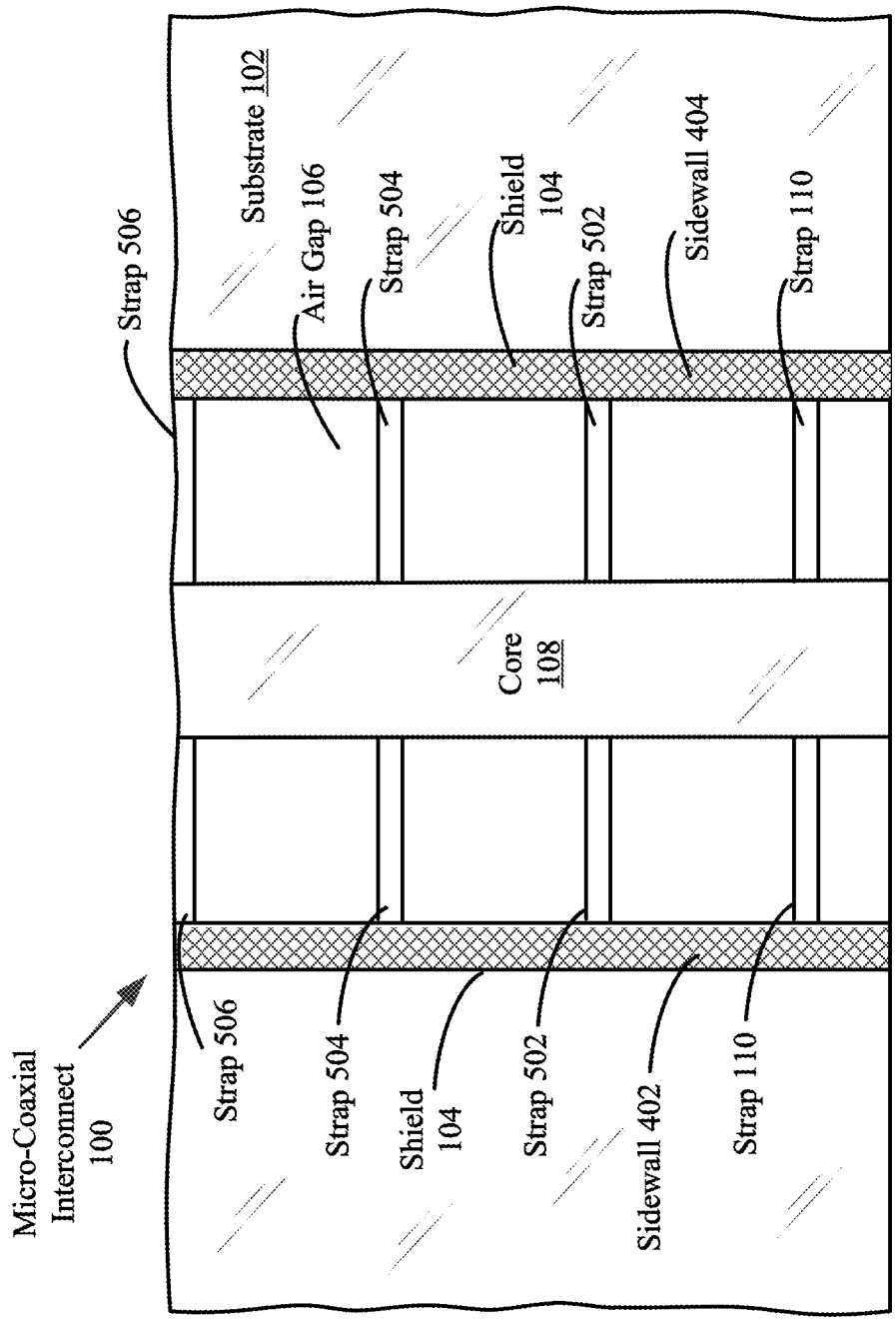
FIG. 5 is a cross-sectional view of the exemplary structure shown in FIGS. 1-4 taken along line 5-5 of FIG. 4.

An air gap 400 is provided between the shield 104 and core 106 along their entire lengths. In this regard, the core 106 is suspended within the shield 104 via a plurality of straps 406, 502-506. The straps 406, 502-506 are formed of a dielectric material (e.g., a Su-8 epoxy), and are spaced apart along the length of the core 106. Adjacent straps can have equal spacing (as shown in FIG. 5 or unequal spacing (not shown). Each strap extends transverse to the core 108 between two sidewalls 402 and 404 of the shield 104. The spacing between the sidewalls 402, 404 and the core 106 are substantially the same along the entire length of the micro-coaxial interconnect 100.

The cantilevered portion 110 extends over the well 108 a certain distance 606 (e.g., ≥1 mm). The core 106 of the cantilevered portion 110 has a first portion 202 that is angled relative to a second portion 204. The angle 300 between the first and second portions 202, 204 is selected in accordance with the requirements of a particular application. In most scenarios, the angle 300 has a value between eighty degrees and one hundred degrees. Also, the first portion 202 can extend in a +y direction as shown in FIG. 2 or alternatively is a −y direction (not shown). The first portion 202 can extend in the −y direction when the optical device sits in a deep well such that the interconnect is required to bend down into the well.

Similarly, the shield 104 of the cantilevered portion 110 has a first portion 206 that is angled relative to a second portion 208. The angle between the first and second portions 206, 208 is selected in accordance with any application. In some scenarios, the angle has a value between eighty degrees and one hundred degrees. The angle between portions 206, 208 of the core 106 may be the same as or different than the angle between portions 202, 204 of the shield 104. Also, the first portion 206 can extend in a +y direction as shown in FIG. 2 or alternatively is a −y direction (not shown). The first portion 206 can extend in the −y direction when the optical device sits in a deep well such that the interconnect is required to bend down into the well.

The angled arrangement between the first and second portions 202/204, 206/208 provides a means to minimize a lateral force (i.e., a pushing force or a pulling force) applied by the micro-coaxial interconnect 100 to a coupler (e.g., coupler 606 of FIG. 6) electrically coupling the circuit component (e.g., the Lithium Niobate optical device 604 of FIG. 6) to the first portion(s) 202, 206 thereof. The term "lateral force", as used herein, refers to a force applied in a first direction towards the coupler and/or a second direction away from the coupler. Application of the lateral force results from mismatching movements of the circuit component and the base substrate 102. The mismatching movements occur in response to temperature increases and decreases within a surrounding environment. In this regard, it should be understood that the core 106 can bend at the joint 302 between the first and second portions 202, 204 along the length of the cantilevered portion. Similarly, the shield 104 can bend at the joint between the first and second portions 206, 208 and along the length of the cantilevered portion. Such bending ensures that any electrical connection between the micro-coaxial interconnect 100 and another electronic component remains intact despite such mismatching movements and temperature changes. The bending can facilitate movement of the core 106 (as well as the shield 104) in the ±Y direction (as indicated by the arrows 304, 306 in FIG. 3) and in the ±Z direction.

Notably, an aperture 112 is formed in the shield 104 such that at least the first portion 202 of the core 106 is exposed and accessible for coupling to a circuit component (e.g., optical device 604 of FIG. 6). Additionally, an end wall 114 of the shield 104 comprises the first portion 206 which protrudes out and away therefrom by a distance selected to allow coupling of the first portion 206 to the circuit component.

Figure 7:
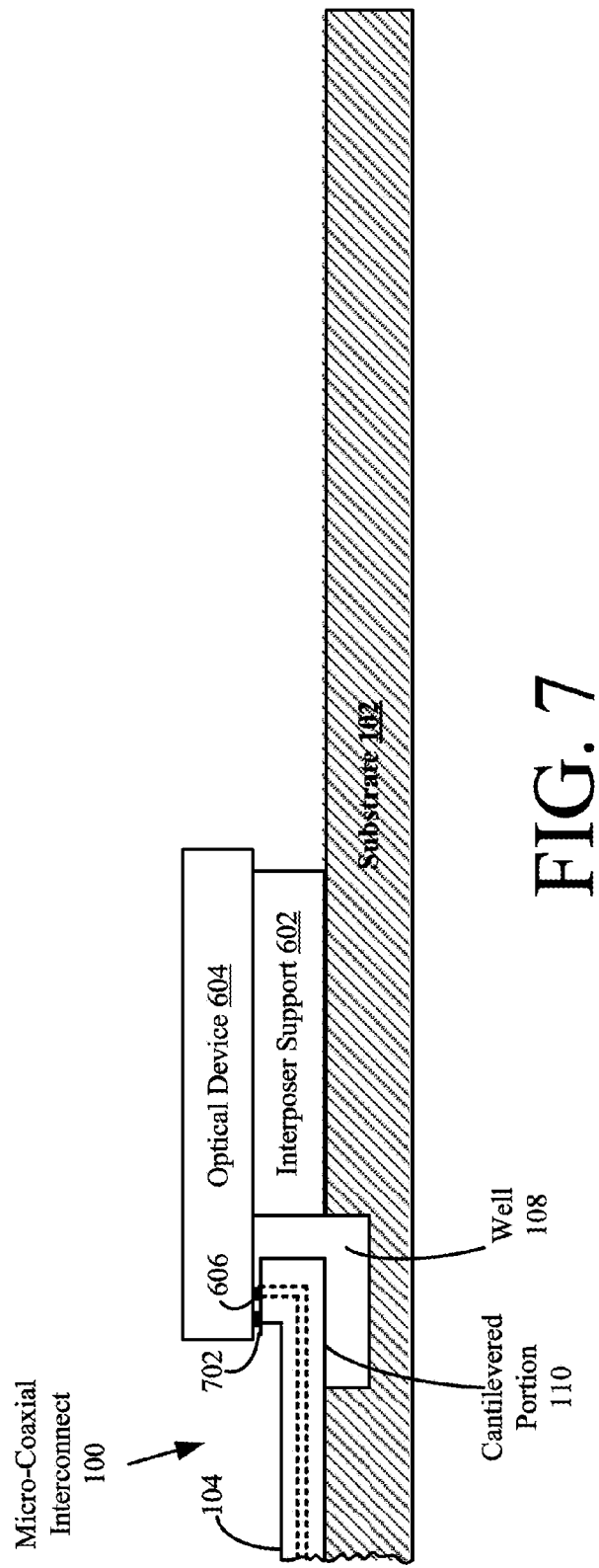

The micro-coaxial interconnect structure shown in FIGS. 1-5 has superior loss and dispersion characteristics that can enable micro-coaxial interconnects which run at greater than 100 Gb/s and are compatible with IC and optical device interfaces. As such, the micro-coaxial interconnect 100 can be used with an IC or optical device applications. An exemplary embodiment showing connection to an optical device is shown in FIG. 6-7. In these scenarios, the first portion 202 of the core 106 is electrically coupled to a corresponding contact of an optical device 604. The shield 104 may also be optionally coupled to a corresponding contact of the optical device 604. This electrical coupling can be achieved using any known or to be known electrical coupling technique, such as soldering or adhesion (e.g., via a conductive epoxy). If soldering is used, then solder bumps 606, 702 create the electrical connections between the optical device 604 and micro-coaxial interconnect 100.

Since the CTE of the optical device 604 is different than the CTE of the substrate 102, an interposer support 602 is provided therebetween. Interposer supports are well known in the art, and therefore will not be described herein. Any known or to be known interposer support can be used herein without limitations.

Figure 8:
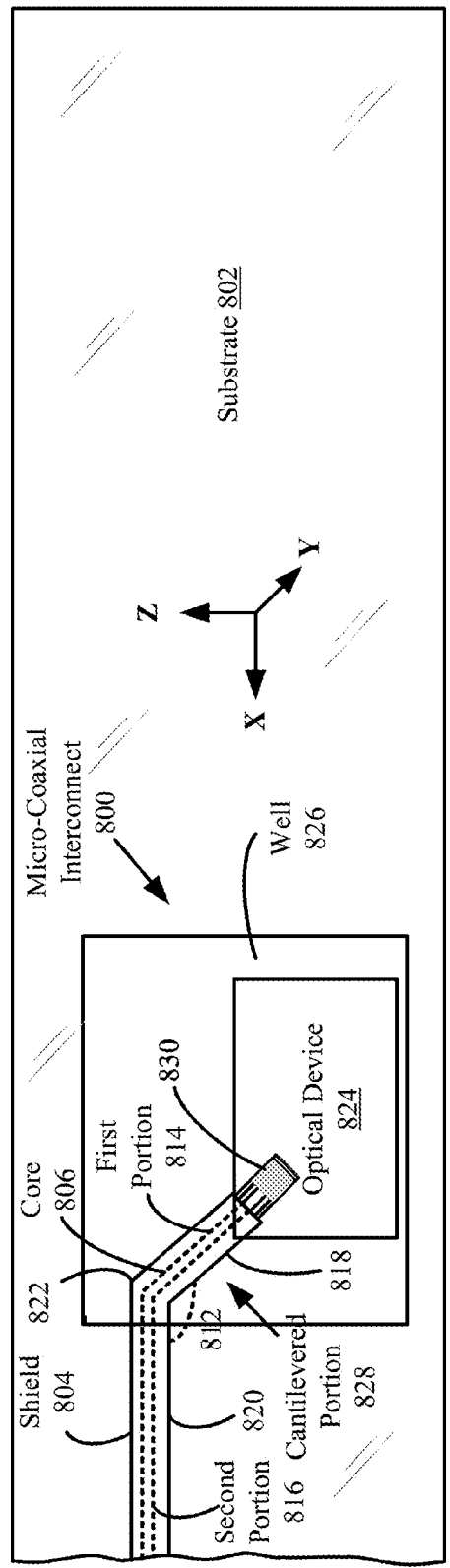
FIG. 8 is a top perspective view of another exemplary structure for a micro-coaxial interconnect disposed on a substrate.

Notably, the micro-coaxial interconnect configuration shown in FIGS. 1-5 is shown as being used with an optical device 604 having a flip-chip configuration, while a micro-coaxial interconnect architecture of FIG. 8 is shown as being used with an optical device 822 having a face-up chip configuration. The present invention is not limited in this regard. For example, the micro-coaxial interconnect architecture of FIG. 8 can additionally be used with an electronic device having a flip-chip configuration. Flip-chip and face-up configurations are well known in the art, and therefore will not be described herein.

As shown in FIG. 8, a micro-coaxial interconnect 800 comprises two joints. The present invention is not limited in this regard. The micro-coaxial interconnect 800 can comprise any number of joints selected in accordance with the requirements of a particular applications.

A first joint (not visible in FIG. 8) of the micro-coaxial interconnect 800 is similar to joint 200 shown in FIGS. 1-5. The first joint is coupled to an electrical contact 830 of the optical device 824. The first joint allows the cantilevered portion 828 to move in a first direction (e.g., the +Y direction and the −Y direction) along with corresponding movement of the optical device 824.

A second joint 822 is formed on the cantilevered portion 828 of the micro-coaxial interconnect 800. The second joint 822 allows the cantilevered portion 828 to move in a second direction different from the first direction (e.g., in the +X direction and the −X direction) along with corresponding movement of the optical device 824. In this regard, the micro-coaxial interconnect 800 has: a core 806 with a first portion 814 extending in the Z direction and a second portion 816 extending in the X direction; and a shield 804 having a first portion 818 extending in the Z direction and a second portion 820 extending in the X direction. The angle 812 between the first and second portions 814/816 and 818/820 can have any value selected in accordance with a particular application. For example, the value of angle 812 can be equal to or greater than ten degrees. The first portion 814 of the cantilever may also include serpentine or zigzag bends along the length of the structure. Both shield and central conductor should make corresponding bends so that the internal spacing between shield and center remains approximately constant.

Figure 9:
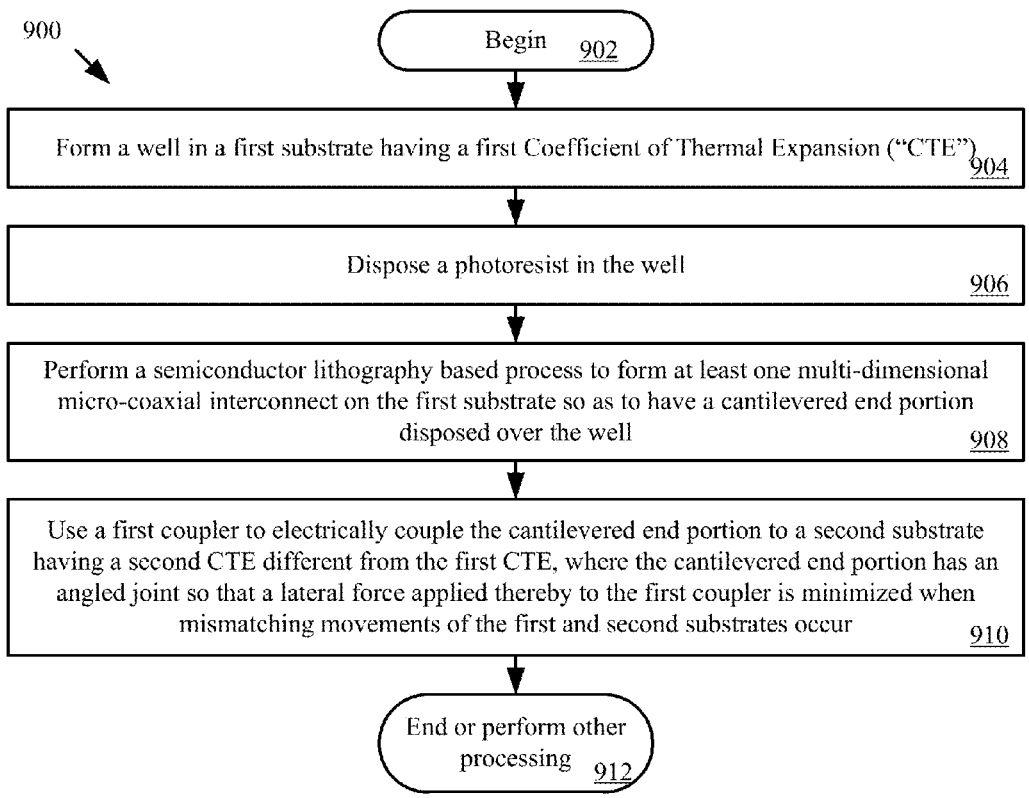
FIG. 9 is a flow diagram of an exemplary method for providing a micro-coaxial interconnect in an electronic circuit.

Referring now to FIG. 9, there is provided a flow diagram of an exemplary method 900 for providing a micro-coaxial interconnect in an electronic circuit. The method 900 begins with step 902 and continues with step 904. In step 904, a well (e.g., well 108 of FIG. 1) is formed in a first substrate (e.g., substrate 102 of FIG. 1) having a first CTE. Next, a photoresist is disposed in the well, as shown by step 906. In some cases, an optical device is to be disposed in the well. As such, step 906 would be performed after the optical device has been mounted within the well. Thereafter in step 908, a semiconductor lithography based process is performed to form at least one three-dimensional micro-coaxial interconnect (e.g., micro-coaxial interconnect 100 of FIG. 1) on the first substrate so as to have a cantilevered end portion (e.g., cantilevered end portion 110 of FIG. 1) disposed over the well. In this regard, it should be understood that the photoresist is removed from the well after the cantilevered portion is formed during the semiconductor lithography based process.

Next, a first coupler (e.g., solder bump 606 of FIG. 6) is used to electrically couple the cantilevered end portion to an electrical contact disposed on a second substrate (e.g., a Lithium Niobate substrate of the optical device 604 of FIG. 6) having a second CTE different from the first CTE, as shown by step 910. The cantilevered end portion has a first angled joint (e.g., joint 302 of FIG. 3) so that a lateral force applied thereby to the first coupler is minimized when mismatching movements of the first and second substrates occur. In some scenarios, the three-dimensional micro-coaxial interconnect comprises at least one second angled joint (e.g., angled joint 822 of FIG. 8) allowing movement of the cantilevered end portion in a direction different from that allowed by the first angled joint. Upon completing step 910, step 912 is performed where method 900 ends or other processing is performed.

In some scenarios, the three-dimensional micro-coaxial interconnect is formed using a semiconductor lithography based process. The micro-coaxial interconnect comprises a three-dimensional structure defined by an elongate conductive shield (e.g., shield 104 of FIG. 1), an elongate conductive core (e.g., core 106 of FIG. 1) disposed within the elongate conductive shield, an air gap (e.g., air gap 400 of FIG. 4) between the elongate conductive shield and the elongate conductive core, and a plurality of dielectric straps (406 of FIG. 4) suspending the elongate conductive core within the elongate conductive shield.

The angled joint is defined by a first portion of the three-dimensional micro-coaxial interconnect that is angled relative to a second portion of the three-dimensional micro-coaxial interconnect by at least ten degrees. The angled joint may reside along the cantilevered end portion of the three-dimensional micro-coaxial interconnect or along a portion other than the cantilevered end portion of the three-dimensional micro-coaxial interconnect.

In some scenarios, the cantilevered portion may follow a serpentine geometry or a zigzag geometry to allow relative motion between chip and substrate without producing (a) excessive tension or compression along the micro-coaxial interconnect or (b) excessive shear or tension at the contacts to the substrate or the chip. An object of the present invention is to provide a means to relax shear and tensile stress through bending of the interconnect over an extended portion. This means of accommodation spreads mechanical distortion over a broad area and avoids stress concentration points that might cause breakage and loss of electrical continuity.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

We claim:

1. An Integrated Circuit ("IC"), comprising:
    a first substrate having a first Coefficient of Thermal Expansion ("CTE") and a well formed therein;
    at least one three-dimensional micro-coaxial interconnect formed on the first substrate so as to have a cantilevered end portion disposed over the well; and
    a first coupler electrically coupling the cantilevered end portion to a second substrate having a second CTE different from the first CTE;
    wherein the cantilevered end portion has a first angled joint so that at least one of a pushing force and a pulling force applied thereby to the first coupler is minimized when mismatching movements of the first and second substrates occur.

2. The IC according to claim 1, wherein the first coupler electrically couples a conductive core of the cantilevered end portion to the second substrate.

3. The IC according to claim 2, wherein a second coupler electrically couples a shield of the cantilevered end portion to the second substrate.

4. The IC according to claim 1, wherein the three-dimensional micro-coaxial interconnect is formed using a semiconductor lithography based process.

5. The IC according to claim 1, wherein the micro-coaxial interconnect comprises a three-dimensional structure defined by
    an elongate conductive shield,
    an elongate conductive core disposed within the elongate conductive shield,
    an air gap between the elongate conductive shield and the elongate conductive core, and
    a plurality of dielectric straps suspending the elongate conductive core within the elongate conductive shield.

6. The IC according to claim 1, wherein the first angled joint is defined by a first portion of the three-dimensional micro-coaxial interconnect that is angled relative to a second portion of the three-dimensional micro-coaxial interconnect by at least ten degrees.

7. The IC according to claim 1, wherein the first angled joint resides along the cantilevered end portion of the three-dimensional micro-coaxial interconnect.

8. The IC according to claim 1, wherein the three-dimensional micro-coaxial interconnect comprises a second angled joint which allows movement of the cantilevered end portion in a direction different from a direction which is allowed by the first angled joint.

9. The IC according to claim 1, wherein the coupler is solder or a conductive adhesive.

10. The IC according to claim 1, wherein the cantilevered end portion has a serpentine geometry or a zigzag geometry.

11. A method for providing a mechanically compliant micro-coaxial interconnect with an Integrated Circuit ("IC") or other electronic device, comprising:
    forming a well in a first substrate having a first Coefficient of Thermal Expansion ("CTE");
    forming at least one three-dimensional micro-coaxial interconnect on the first substrate so as to have a cantilevered end portion disposed over the well; and
    using a first coupler to electrically couple the cantilevered end portion to a second substrate having a second CTE different from the first CTE;
    wherein the cantilevered end portion has a first angled joint so that at least one of a pulling force and a pushing force applied thereby to the first coupler is minimized when mismatching movements of the first and second substrates occur.

12. The method according to claim 11, wherein the first coupler electrically couples a conductive core of the cantilevered end portion to the second substrate.

13. The method according to claim 12, wherein a second coupler electrically couples a shield of the cantilevered end portion to the second substrate.

14. The method according to claim 11, wherein the three-dimensional micro-coaxial interconnect is formed using a semiconductor lithography based process.

15. The method according to claim 11, wherein the three-dimensional micro-coaxial interconnect comprises a three-dimensional structure defined by
   an elongate conductive shield,
   an elongate conductive core disposed within the elongate conductive shield,
   an air gap between the elongate conductive shield and the elongate conductive core, and
   a plurality of dielectric straps suspending the elongate conductive core within the elongate conductive shield.

16. The method according to claim 11, wherein the first angled joint is defined by a first portion of the three-dimensional micro-coaxial interconnect that is angled relative to a second portion of the three-dimensional micro-coaxial interconnect by at least ten degrees.

17. The method according to claim 11, wherein the first angled joint resides along the cantilevered end portion of the three-dimensional micro-coaxial interconnect.

18. The method according to claim 11, wherein the three-dimensional micro-coaxial interconnect comprises a second angled joint which allows movement of the cantilevered end portion in a direction different from a direction which is allowed by the first angled joint.

19. The method according to claim 11, wherein the coupler is solder or a conductive adhesive.

* * * * *